(12) United States Patent
Ballantyne et al.

(10) Patent No.: US 7,755,437 B2
(45) Date of Patent: Jul. 13, 2010

(54) PHASE LOCKED LOOP SYSTEM HAVING LOCKING AND TRACKING MODES OF OPERATION

(75) Inventors: Gary John Ballantyne, Christchurch (NZ); Gurkanwal Singh Sahota, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 254 days.

(21) Appl. No.: 11/211,248

(22) Filed: Aug. 24, 2005

(65) Prior Publication Data

US 2007/0052489 A1   Mar. 8, 2007

(51) Int. Cl.
*H03L 7/085* (2006.01)
(52) U.S. Cl. .................. 331/17; 327/553; 327/554; 333/17.1; 455/307
(58) Field of Classification Search ............. 332/127; 331/17; 327/553, 554; 333/17.1; 455/307
See application file for complete search history.

(56) References Cited

U.S. PATENT DOCUMENTS

| | | | | |
|---|---|---|---|---|
| 3,993,958 A | * | 11/1976 | Cutsogeorge | 331/25 |
| 4,394,778 A | * | 7/1983 | Ikeguchi et al. | 455/182.2 |
| 5,389,899 A | * | 2/1995 | Yahagi et al. | 331/10 |
| 5,654,675 A | | 8/1997 | Bruccoleri et al. | |
| 5,802,450 A | | 9/1998 | Horton | |
| 5,977,838 A | | 11/1999 | Nagoya et al. | |
| 6,025,743 A | | 2/2000 | Abe | |
| 6,064,273 A | * | 5/2000 | Donohue | 331/17 |
| 6,097,227 A | | 8/2000 | Hayashi | |
| 6,157,271 A | * | 12/2000 | Black et al. | 332/127 |
| 6,202,102 B1 | * | 3/2001 | Kuroiwa et al. | 710/14 |
| 6,476,681 B1 | * | 11/2002 | Kirkpatrick | 331/17 |
| 6,549,599 B2 | * | 4/2003 | Momtaz | 375/376 |
| 6,856,202 B2 | * | 2/2005 | Lesso | 331/1 A |
| 6,963,620 B2 | * | 11/2005 | Lee et al. | 375/295 |

(Continued)

FOREIGN PATENT DOCUMENTS

EP   0731565   9/1996

(Continued)

OTHER PUBLICATIONS

Razavi, B., RF CMOS transceivers for cellular telephony, IEEE Communications Magazine, vol. 41, No. 8, pp. 144-149, Aug. 2003.

(Continued)

*Primary Examiner*—Robert Pascal
*Assistant Examiner*—Levi Gannon
(74) *Attorney, Agent, or Firm*—Jiayu Xu (57) ABSTRACT

An embodiment pertains to a phase locked loop (PLL) circuit. The PLL includes a voltage controlled oscillator which outputs a signal at a desired frequency. A phase detector is coupled to an output from the voltage controlled oscillator. The phase detector compares the phase of a signal output from the voltage controlled oscillator (VCO) with the phase of a reference signal. A loop filter is coupled to the VCO and the phase detector. The loop filter has a locking mode of operation for locking the phase of the VCO signal to the phase of the reference signal. The loop filter can subsequently be placed in a tracking mode of operation which adjusts the phase of the VCO signal to track the phase of the reference signal.

12 Claims, 11 Drawing Sheets

U.S. PATENT DOCUMENTS

2003/0020550 A1 1/2003 Nelson et al.

FOREIGN PATENT DOCUMENTS

| WO | 9740586 | 10/1997 |
|---|---|---|
| WO | 0101577 | 1/2001 |

OTHER PUBLICATIONS

National Semiconductor, An Analysis and Performance Evaluation of a Passive Filter Design Technique for Charge Pump PLL's, National Semiconductor, Application Note 1001, pp. 1-8, Jul. 2001.
International Search Report-PCT/US06/033055, International Search Authority-European Patent Jan. 31, 2007.
Written Opinion-PCT/US06/033055, International Search Authority-European Patent Jan. 31, 2007.

* cited by examiner

PHASE LOCKED LOOP SYSTEM HAVING LOCKING AND TRACKING MODES OF OPERATION

BACKGROUND

1. Field

The present invention relates to a phase locked loop system having locking and tracking modes of operation.

2. Background

Today, virtually every wireless device, such as cell phones, wireless laptops, personal digital assistants having wireless capabilities, WiFi networking equipment, etc., contains one or more phase locked loop (PLL) circuits. Basically, a PLL circuit is used to synthesize or otherwise generate precise, stable high frequency signals. Typically, in a PLL circuit, a reference signal is input to a phase detector or a phase-frequency detector. The phase detector compares the input reference signal to the output signal from a voltage controlled oscillator (VCO). The difference in the phase between these two signals is determined and the resultant difference signal is then processed by a loop filter. The function of the loop filter is to stabilize the loop and to filter out unwanted noise in the system. The filtered signal is input to control the operation of the VCO. In turn, the output from the VCO is fedback as an input to the phase detector via an integer divider, fractional divider, or a mixer. This feedback loop acts to servo the output from the VCO to that of the reference signal. By itself, the VCO is unstable and tends to drift in terms of frequency and phase, which is highly undesirable and problematic. However, by feeding back the VCO output signal and essentially enslaving the VCO to the reference signal, a more stable and precise output signal is thereby achieved.

Due to their unique ability to generate precise and yet stable high frequency signals, PLL circuits are found in a wide variety of applications ranging from modulators and demodulators to encoders and decoders, as well as controllers and other circuitry which make use of such high frequency signals. In the case of modulators, one common application of a PLL circuit entails applying phase modulation to a carrier signal. The phase modulated carrier signal is then processed and transmitted over-the-air as a radio frequency (RF) signal. Typically, the baseband I and Q signals containing speech and/or data information, are converted into an intermediate frequency (IF) signal by a phase quadrature modulator. This IF signal is then input to the PLL circuit as the reference signal. Initially, the PLL circuit locks onto the reference IF signal, and later it subsequently tracks the phase of the reference IF signal. In this manner, the high frequency signal output from the PLL circuit is essentially enslaved to the phase of the information carrying IF signal. Consequently, the PLL circuit performs the critical functions of upconverting the IF signal to the higher frequency of the carrier signal, while at the same time, locking onto and tracking the phase of the reference IF signal from the phase quadrature modulator.

Ideally, the PLL circuit would have the ability to instantaneously lock onto and then precisely track the phase of the reference IF signal. Unfortunately, these two goals are conflicting due to the physics underlying filter designs when applied to the loop filter of a PLL circuit. One type of PLL design, commonly referred to as a Type 2 PLL, enables the DC operating point of the VCO to be set over a wide range of voltages. This is advantageous because it directly translates into superior locking performance. However, a Type 2 PLL exhibits poor group delay. The group delay defines the phase characteristics across the frequencies of interest. The deviation in the group delay inherent to Type 2 PLLs causes the phase of the VCO to deviate from that of the reference IF signal. Hence, the Type 2 PLL is not well suited for tracking the IF signal, once lock has been established.

Another type of PLL design, commonly referred to as a Type 1 PLL, has a group delay which is more constant as compared to those of the Type 2 PLL. This characteristic makes the Type 1 PLL superior at tracking the reference IF signal. However, the disadvantage to using a Type 1 PLL is that it becomes harder to set the correct DC operating voltage to the VCO. Initially, the reference IF signal will start off at one phase frequency, whereas the VCO signal has some different, arbitrary phase frequency. The phase of the VCO signal must be made to match, or lock onto, the phase of the reference IF signal. If initially, the phases frequencies of these two signals are far apart, it may be impossible, difficult, or time consuming for a Type 1 PLL to eventually force the phase (and therefore frequency) of the VCO signal to match that of the reference IF signal.

Thus, PLL circuit designers are faced with a dilemma. On the one hand, a PLL circuit can be designed by implementing a Type 1 PLL. The advantage of implementing a Type 1 PLL is its superior tracking performance. The disadvantage is that a Type 1 PLL suffers from degraded locking functionality. On the other hand, a PLL circuit can be designed by implementing a Type 2 PLL. The Type 2 PLL enables the PLL circuit to better lock onto a reference IF signal. However, the downside to using a Type 2 PLL is the fact that it is not the most qualified filter for tracking the reference IF signal.

SUMMARY

Embodiments pertain to a phase locked loop (PLL) circuit. The PLL includes a voltage controlled oscillator which outputs a signal at a desired frequency. A phase detector is coupled to an output from the voltage controlled oscillator. The phase detector compares the phase of a signal output from the voltage controlled oscillator (VCO) with the phase of a reference signal. A loop filter is coupled to the VCO and the phase detector. The loop filter has a locking mode of operation for locking the phase of the VCO signal to the phase of the reference signal. The loop filter can subsequently be placed in a tracking mode of operation which adjusts the phase of the VCO signal to track the phase of the reference signal.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and system for a phase locked loop circuit having lock and tracking modes of operation is disclosed.

Figure 1:
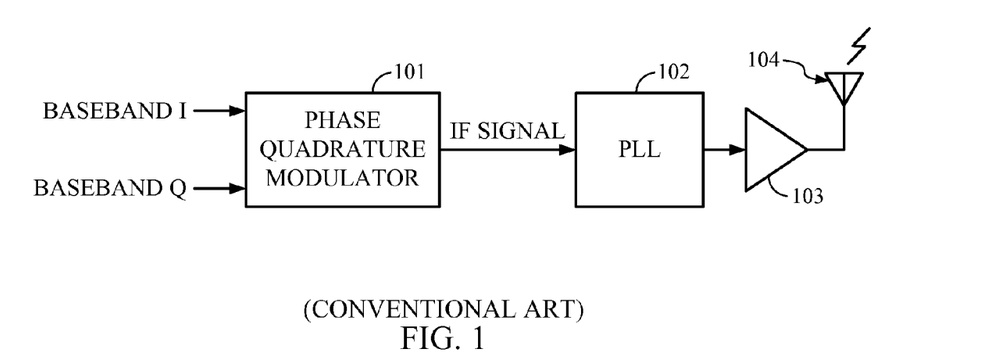
FIG. 1 shows a typical phase modulation transmitter upon which embodiments of the present invention can be implemented.

FIG. 1 shows a typical phase modulation transmitter upon which embodiments of the present invention can be implemented. The baseband I and Q signals containing speech and/or data information, are converted into an intermediate frequency (IF) signal by a phase quadrature modulator 101. This IF signal is then input to the PLL circuit 102 as a reference signal. Based thereon, the PLL circuit 102 generates a precise, stable high frequency signal which is modulated by the information carrying IF signal. The output signal from the PLL circuit 102 locks onto and tracks the reference signal in phase. In this manner, the PLL circuit 102 is effectively phase modulated by the lower frequency IF signal from the phase quadrature modulator 101, while at the same time, the PLL circuit upconverts the reference IF signal into a higher frequency suitable for a carrier signal. The output from the PLL circuit 102 is amplified by amplifier 103 and transmitted over-the-air through antenna 104. It should be noted that in one embodiment, the phase modulation can be applied in the feedback path.

Figure 2:
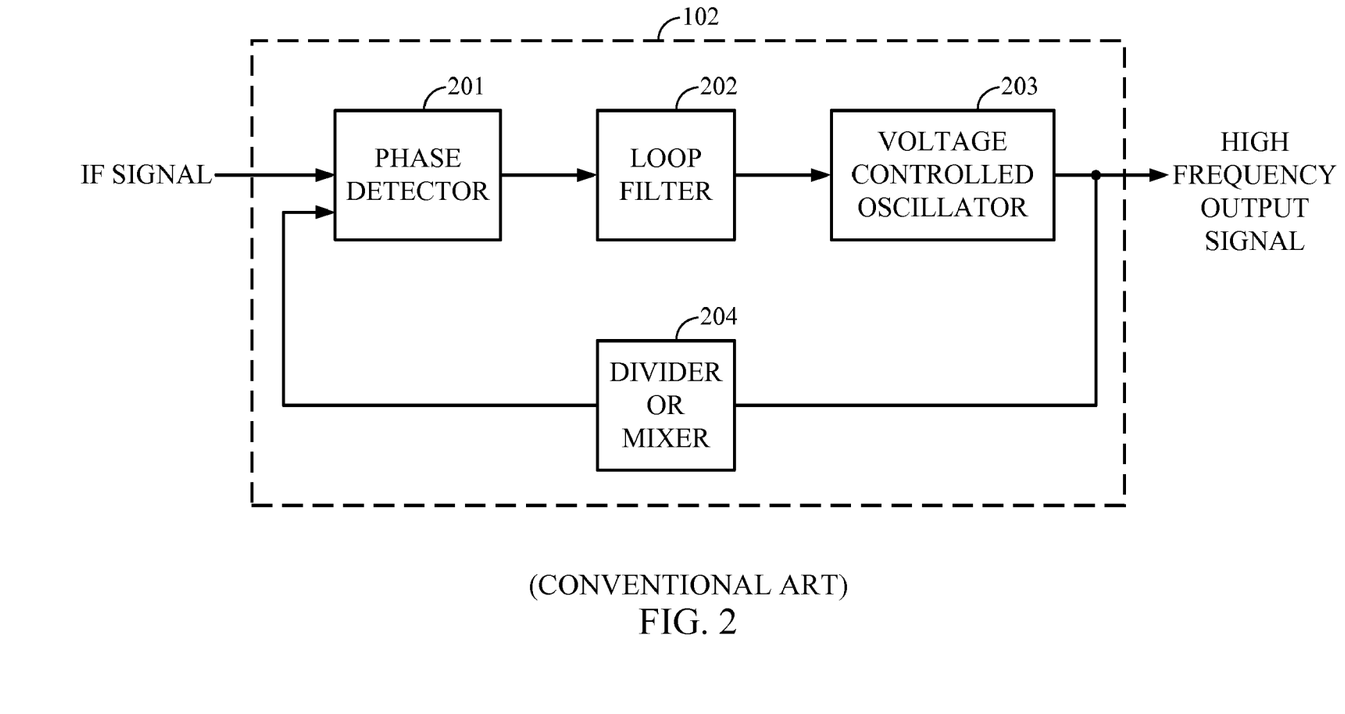
FIG. 2 shows the operational blocks of a PLL circuit.

FIG. 2 shows the operational blocks of a PLL circuit 102. Initially, a reference signal is input to a phase detector 201. The phase detector 201 compares the input reference signal to the output signal from the voltage controlled oscillator (VCO) 203. The difference in the phase between these two signals is determined and the resultant difference signal is then filtered by loop filter 202. Loop filter 202 stabilizes the loop and serves to filter out unwanted noise in the system. The filtered signal is input to control the operation of VCO 203. In turn, the output from the VCO 203 is fedback as an input to the phase detector 201 via a divider or mixer 204. With an integer divider, the VCO frequency is reduced by an integer factor; with a fractional divider, the VCO frequency is reduced by a fractional factor; and with a mixer, the VCO output is mixed to a lower frequency by a second signal offset in frequency from the VCO. This feedback loop acts to servo the output from the VCO 203 to that of the reference signal. By feeding back the VCO output signal and essentially enslaving the VCO 203 to the reference signal, a stable and highly accurate output signal is produced.

Figure 3:
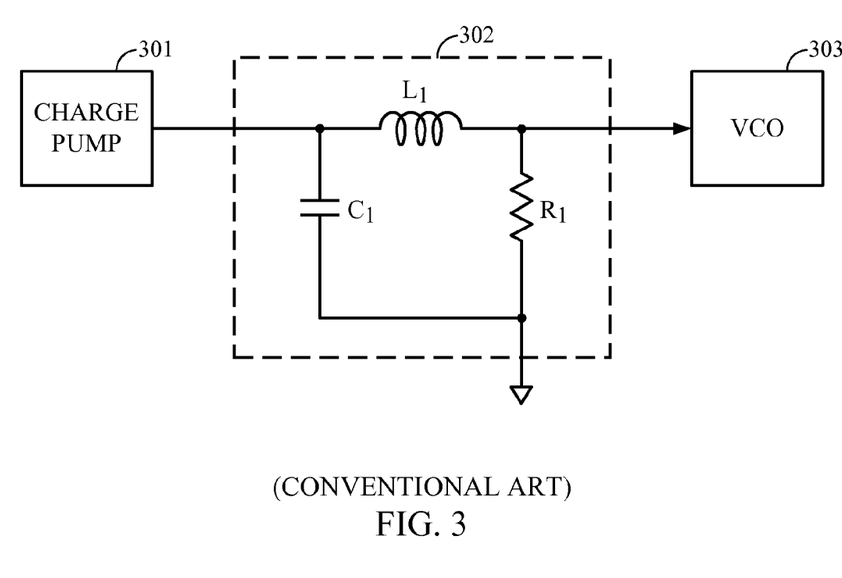
FIG. 3 shows a typical Type 1 PLL.

For illustration, FIG. 3 shows a loop filter 302 which can be used in a typical Type 1 PLL. It should be noted that Type 1 and Type 2 relate to the PLL, which includes the loop filter. Basically, the loop filter influences, through the open loop transfer function, whether the PLL is Type 1 or Type 2. For a Type 1 PLL, the open loop transfer function of the PLL has a single pole approximately at the origin. For a Type 2 PLL, the open loop transfer function of the PLL has two poles approximately at the origin. It should be noted that some phase detectors have a voltage output (rather than a current output from a charge pump), in which case, the same loop filter can change the PLL from Type 1 to Type 2. In addition, due to capacitor leakage currents and other practical effects, the pole(s) may be slightly off the origin. Loop filter 302 accepts a signal from a charge pump 301. Charge pump 301 is part of the phase detector. The output from charge pump 301 is a current. The loop filter 302 corresponding to a Type 1 PLL filter is comprised of an inductor L1, a capacitor C1, and a resistor R1. The inductor L1 is coupled in series between the charge pump 301 and VCO 303. The capacitor C1 and resistor R1 are coupled to the respective ends of inductor L1 to ground. The output from the Type 1 loop filter 302 is coupled as an input to the VCO 303.

Figure 4:
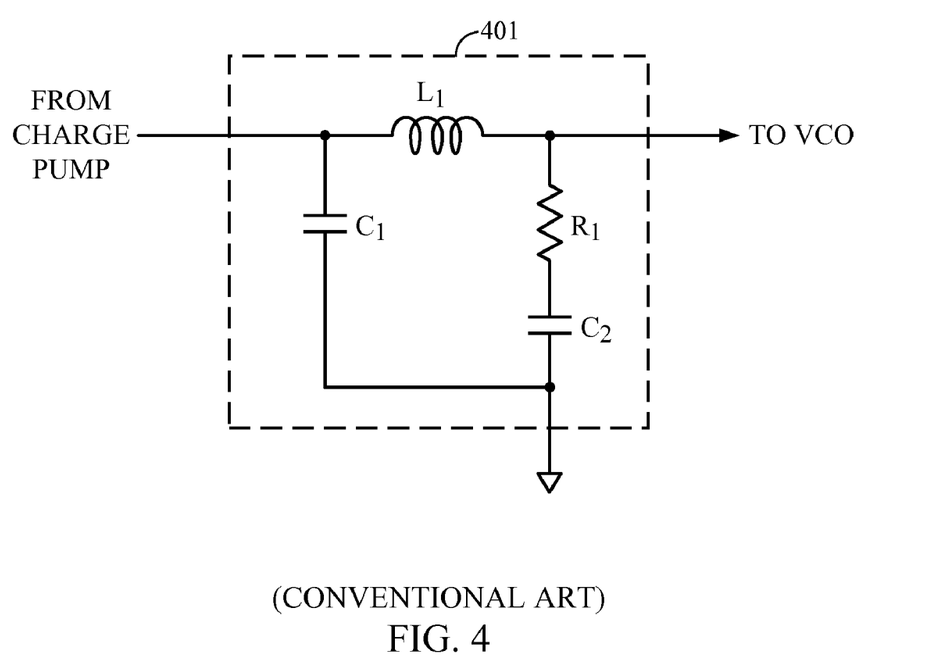
FIG. 4 shows a typical Type 2 PLL.

By way of comparison, FIG. 4 shows a loop filter 401, which can be used in a typical Type 2 PLL. The loop filter 401 accepts a signal from a charge pump. The output from the charge pump is a current which corresponds to the phase difference between the VCO output and the reference signal. The loop filter 401 is comprised of an inductor L1, two capacitors C1 and C2, and a resistor R1. The inductor L1 is coupled in series between the charge pump and the VCO. A capacitor C1 is coupled at one end of inductor L1 (the end coupled to the charge pump) to ground. The other end of inductor L1 (the end coupled to the VCO) has the resistor R1 and capacitor C2 coupled in series to ground. The output from the loop filter 401 is coupled as an input to the VCO.

Figure 5:
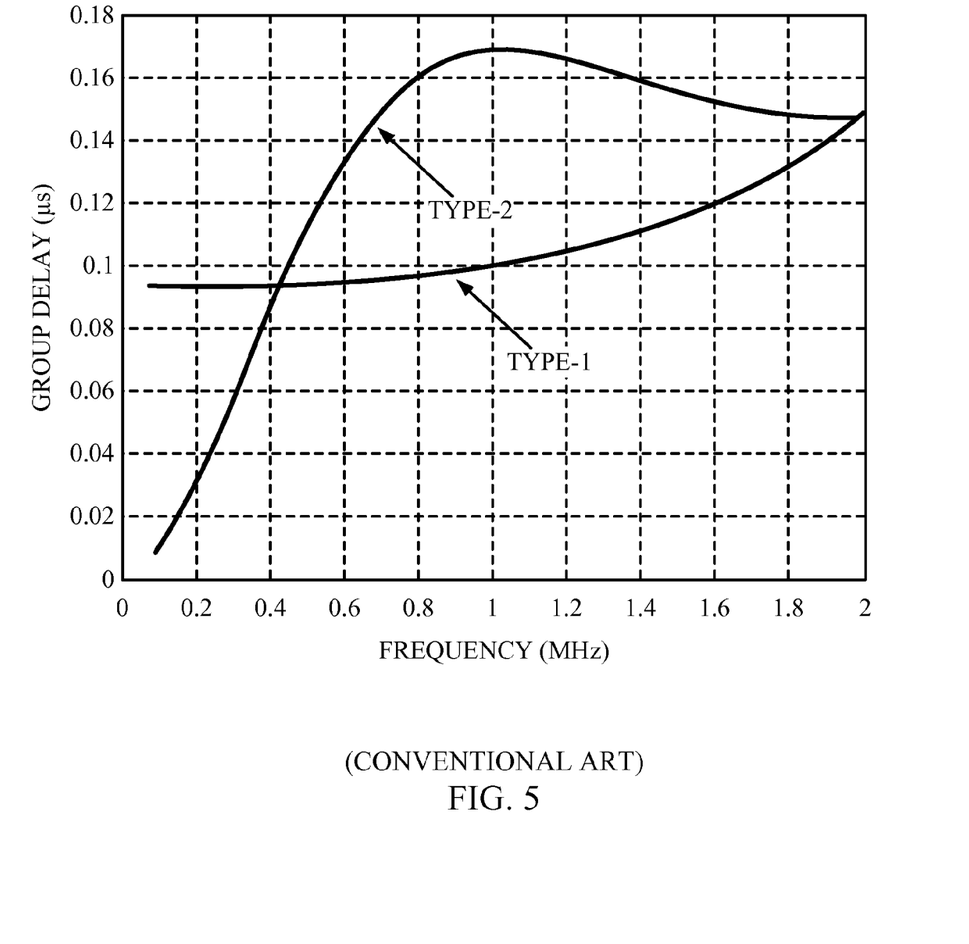
FIG. 5 shows a graph depicting the group delay associated with typical Type 1 and Type 2 PLLs.

FIG. 5 shows a graph depicting the group delay associated with typical Type 1 and Type 2 PLLs. It can be seen from this graph that the group delay corresponding to the Type 1 PLL is more constant or "flatter" than the group delay corresponding to the Type 2 loop filters. A flatter group delay is preferable for purposes of tracking phases because there is less deviation. It can be seen that the Type 2 group delay can be improved by increasing the bandwidth. However, increasing the bandwidth is disadvantageous in that it lets more noise pass through the filter at those higher frequencies. Even the slightest increase in transmit noise is detrimental because receive signals are so low in comparison and because receive channels are typically spaced close to transmit channels. Maintaining the purity of the spectral density of a phase modulated transmit signal is of utmost importance. Thus, a Type 1 PLL is preferred over a Type 2 PLL for purposes of phase tracking. However, a Type 2 PLL is better than a Type 1 PLL for initially locking onto the phase of the reference signal.

Figure 6A:
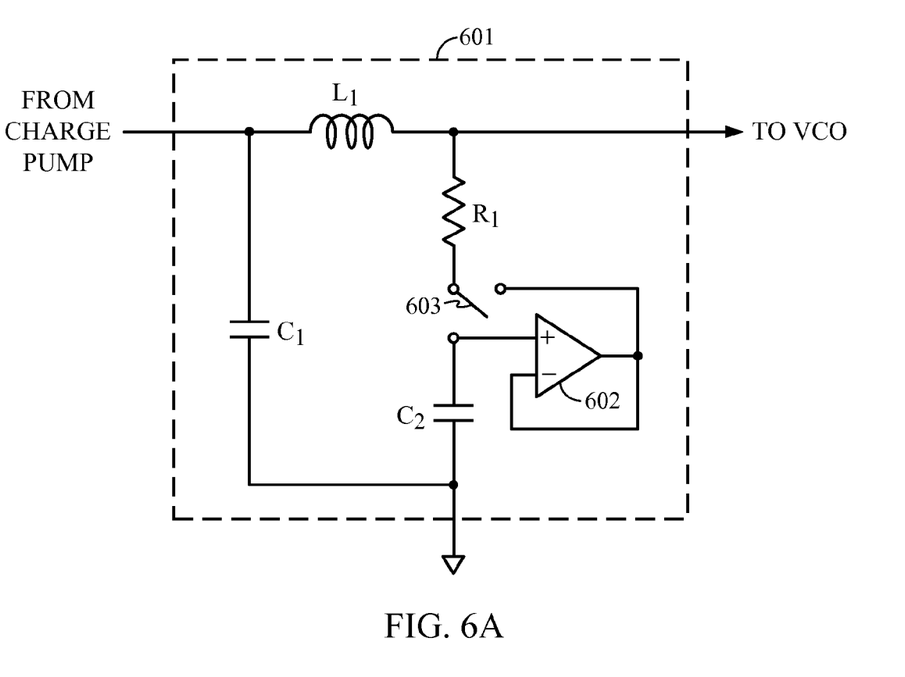
FIG. 6A shows an embodiment of a loop filter that has a switch and an operational amplifier for achieving the benefits from both Type 1 and Type 2 PLLs.

In one embodiment, the benefits from both Type 1 and Type 2 PLLs can be achieved by adding a switch and an operational amplifier, as shown in FIG. 6A. In this embodiment, the loop filter 601 contains a switch 603. By virtue of implementing switch 603, the loop filter 601 can be switched to either having the characteristics of a Type 1 or Type 2 PLL filter. Consequently, when the system is being initialized, switch 603 is set such that the loop filter 601 functions as a Type 2 PLL. This enables the PLL to better lock onto the phase of the reference signal. Once the initial phase lock has been established, switch 603 is set to a Type 1 PLL configuration. This enables the PLL to better track the phase of the reference signal.

In this embodiment, the loop filter 601 is comprised of an inductor L1, two capacitors C1 and C2, a resistor R1, a switch 603, and an operational amplifier 602. The inductor L1 is coupled in series between the charge pump and the VCO. A capacitor C1 is coupled at one end of inductor L1 (the end coupled to the charge pump) to ground. The other end of inductor L1 (the end coupled to the VCO) has the resistor R1 and capacitor C2 coupled in series to ground. The switch 603 is coupled in series in between R1 and C2. Switch 603 is of the single pole, two throw variety. The pole of switch 603 is coupled to one end of resistor R1. One throw of switch 603 is coupled to capacitor C2 and to the positive input of operational amplifier 602. The other throw of switch 603 is coupled to the output of operational amplifier 602. The output from operational amplifier 602 is also fed back to its own negative input terminal. Lastly, the output from the loop filter 601 is coupled as an input to the VCO. In one embodiment, typical values for C1 is 1 nF; L1 is 1 uH; R1 is 50 ohms, and C2 is 5 nF.

When the switch 603 is set in a vertical position, R1 is coupled in series with C2 and operational amplifier 602 has no effect. In other words, loop filter 601 functionally behaves just like the loop filter of the Type 2 PLL described above. And once the loop is locked, it establishes a DC condition whereby all the voltages in the circuit are constant; the voltage on C2 is the same as the voltage on the VCO because there is no current flowing through resistor R1.

Thus, theoretically, loop filter 601 can turn the PLL into a Type 1 PLL by directly connecting R1 to ground, thereby eliminating C2. However, this realistically cannot be done because the voltage accumulated on the VCO would change due to current flowing in R1. So instead of directly connecting R1 to ground, R1 is coupled to a voltage source which is at the same potential as that of the VCO. And because the voltages at both ends of R1 are at the same potential, the result is that there is no current flowing through R1. Essentially, R1 is coupled to an AC ground, but yet the proper voltage is maintained to the VCO. The result is that the PLL functions as a Type 1 PLL for improved tracking.

Referring back to the embodiment shown in FIG. 6, setting switch 604 to a horizontal position, places the output voltage of the operational amplifier 602 at the end of R1. Operational amplifier 602 buffers the voltage across C2. And since the voltage across C2 was made to be the same as that of the VCO during locking, the output from operational amplifier 602 serves as a buffered voltage source, with a voltage equal to the voltage of the VCO. Resistor R1 is thereby coupled to AC ground, which eliminates capacitor C2 from having an effect on the frequency response of the loop filter 601. Thus, setting switch 604 to a horizontal position causes loop filter 601 to turn the circuit into a Type 1 PLL.

Thereby, a processor or controller circuit can be intelligently programmed to selectively toggle switch 603 to place the loop filter 601 into a locking mode of operation or a tracking mode of operation. When switch 603 is controlled by the processor to directly connect R1 in series to C2, loop filter 601 is placed in a locking mode of operation. During the locking mode of operation, the reference signal is unmodulated, and the VCO is accurately locked to the reference signal. After a pre-determined amount of time has elapsed or upon determining successful lock, the processor sets switch 603 to break the connection to capacitor C2 and instead, directly connect R1 to the low impedance output of operational amplifier 602. This places the loop filter 602 into a tracking mode of operation. In the tracking mode of operation, the reference signal is modulated, and the VCO phase is guided to track the modulation.

Figure 6B:
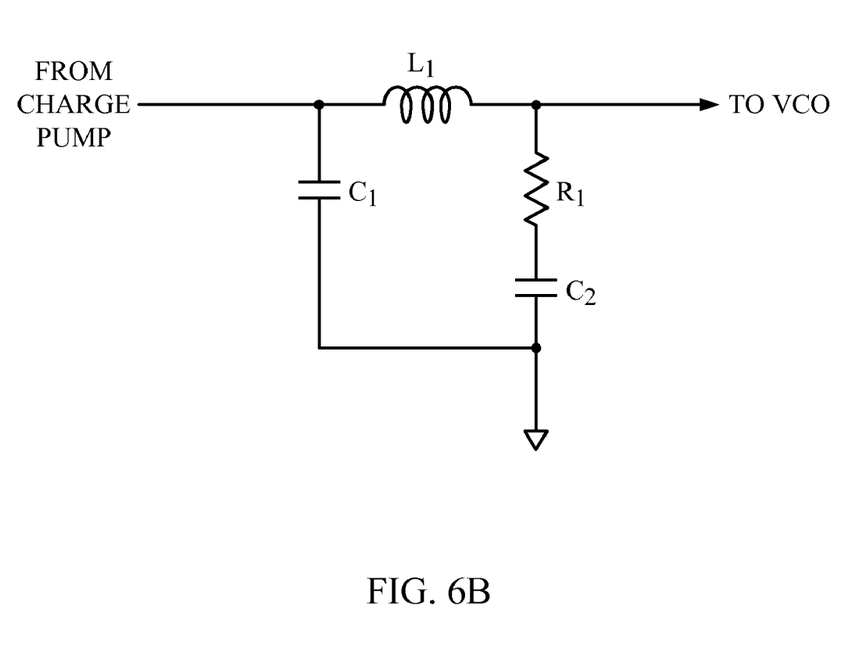
FIG. 6B shows a topology of the loop filter embodiment depicted in FIG. 6A used for a locking mode of operation.

FIG. 6B shows one circuit topology or layout of the loop filter embodiment depicted in FIG. 6A. In this topology, the loop filter is in a locking mode of operation. The input to the operational amplifier is high impedance, so it essentially has no effect and does not factor in the electrical operation of this topology.

Figure 6C:
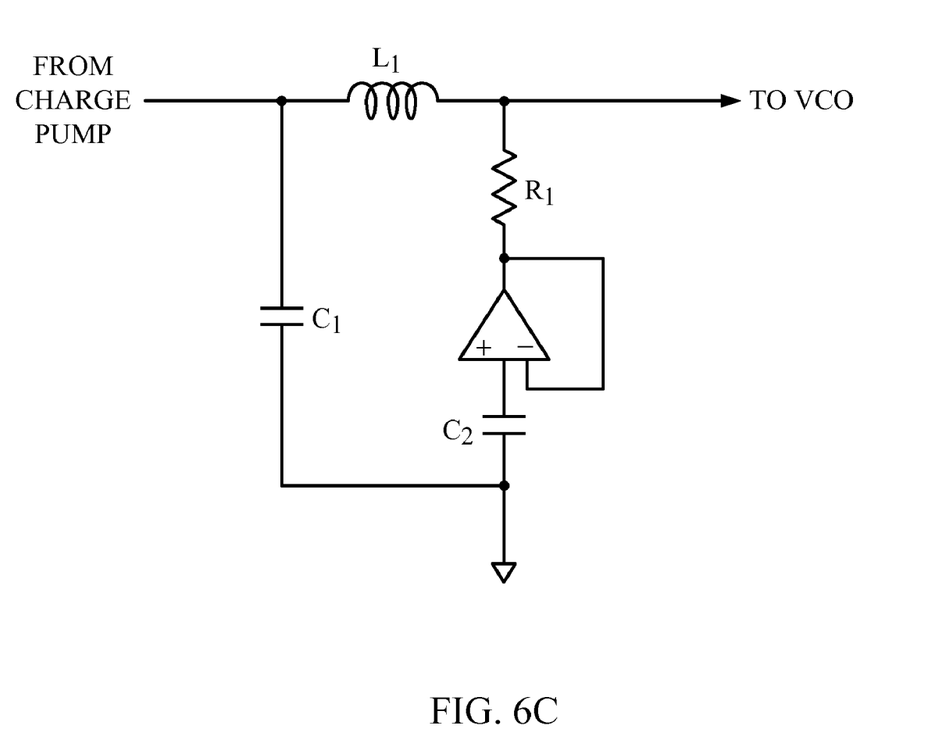
FIG. 6C shows a topology of the loop filter embodiment depicted in FIG. 6B which is used for a tracking mode of operation.

FIG. 6C shows another circuit topology or layout of the loop filter embodiment depicted in FIG. 6B. In this topology, the loop filter is in a tracking mode of operation. Thus, the same loop filter design can have multiple topologies with different topologies being advantageously utilized for its respective functional characteristics. Arranging the operational amplifier and switch allows the topology to be changed.

Figure 7:
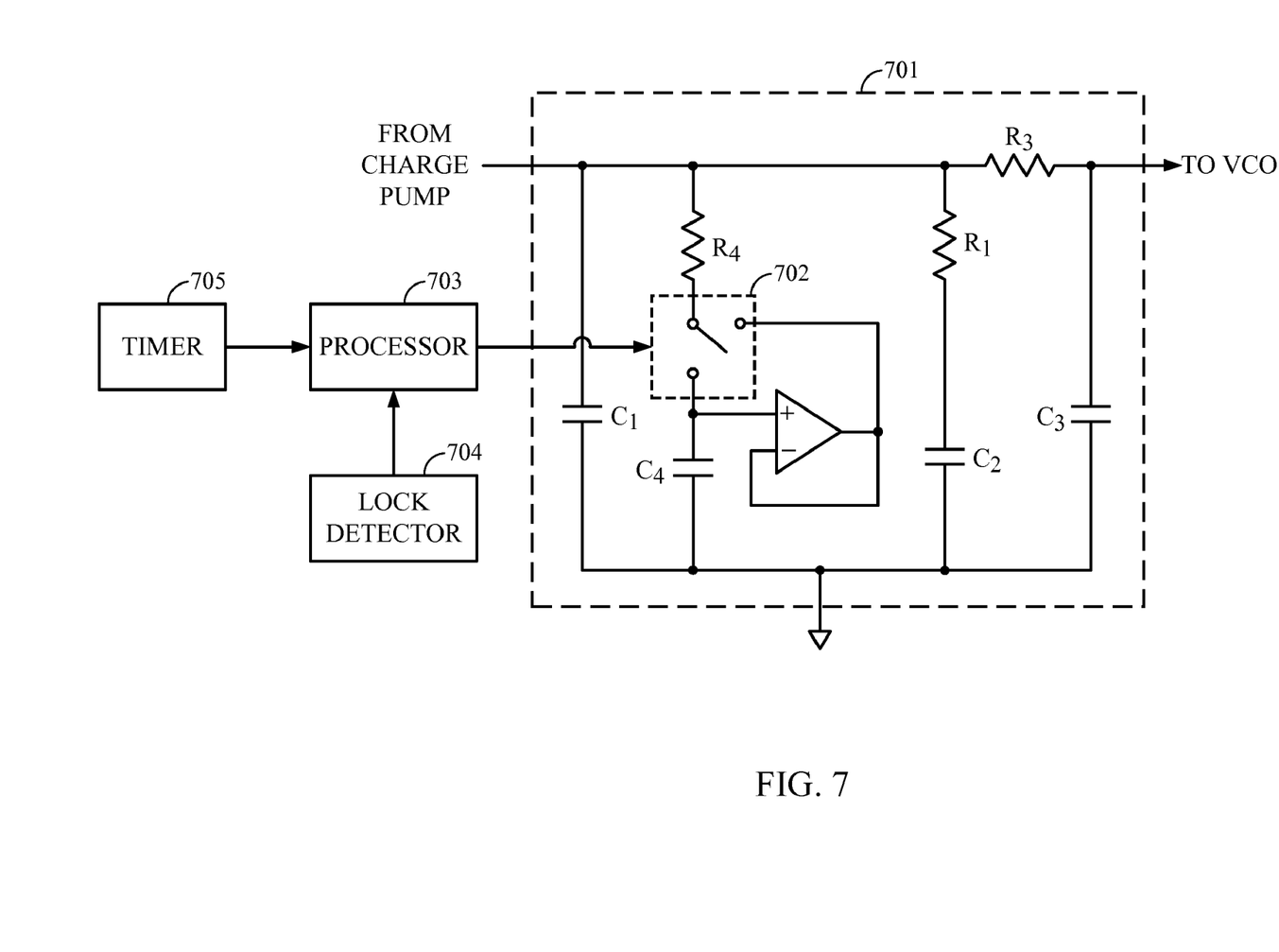
FIG. 7 shows an embodiment of a third order loop filter which has two modes of operation.

FIG. 7 shows an embodiment of a third order loop filter which has two modes of operation. The loop filter 701 is comprised of three resistors R1, R3, and R4, four capacitors C1-C4, a switch 702, and an operational amplifier. In one embodiment, typical values for C1 is 1 nF; R4 is 50 ohms; C4 is 10 nF, R1 is 200 ohms, C2 is 1 nF, R2 is 100 ohms, and C3 is 200 pF. The loop filter has one mode for locking the loop and one for when the loop is tracking. When the loop is locking, the switch 702 is placed in a vertical position which connects R4 to C4. When the switch 702 is placed into a horizontal, locked mode, little or no current flows through R4, and the VCO tuning voltage appears across C4. The operational amplifier buffers C4 and applies its voltage to R4. It should be noted that this kind of sample-and-hold circuitry has a tendency for the voltage to droop as the charge leaks from C4. However, for time-division duplex systems, such as EDGE, the PLL only operates for relatively short intervals, this droop problem is not significant. But for CDMA or other instances exhibiting relatively long intervals, the droop is overcome in other ways (e.g., a DAC instead of the operational amplifier, implementing a low leakage operational amplifier, utilizing a large C4 capacitor, or implementing a voltage source in place of the operational amplifier).

The third order loop filter 701 can be transitioned from the locking to tracking mode in one of several methods. In one embodiment, phase locked loops often have a lock-detect signal that indicates when the loop is locked. The lock-detect signal may be generated by a lock detector 704, for example. This lock-detect signal can be advantageously used to switch between the locking and tracking modes. For example, when the lock-detect signal is set high, a controller or processor 703 toggles switch 702 so that R4 is switched from connecting from C4 to the output of the operational amplifier. In another embodiment, the transition from the locking mode to the tracking mode can be controlled with a delay timer, for example, a timer 705, that allows sufficient time for the loop to lock before changing modes.

Figure 8:
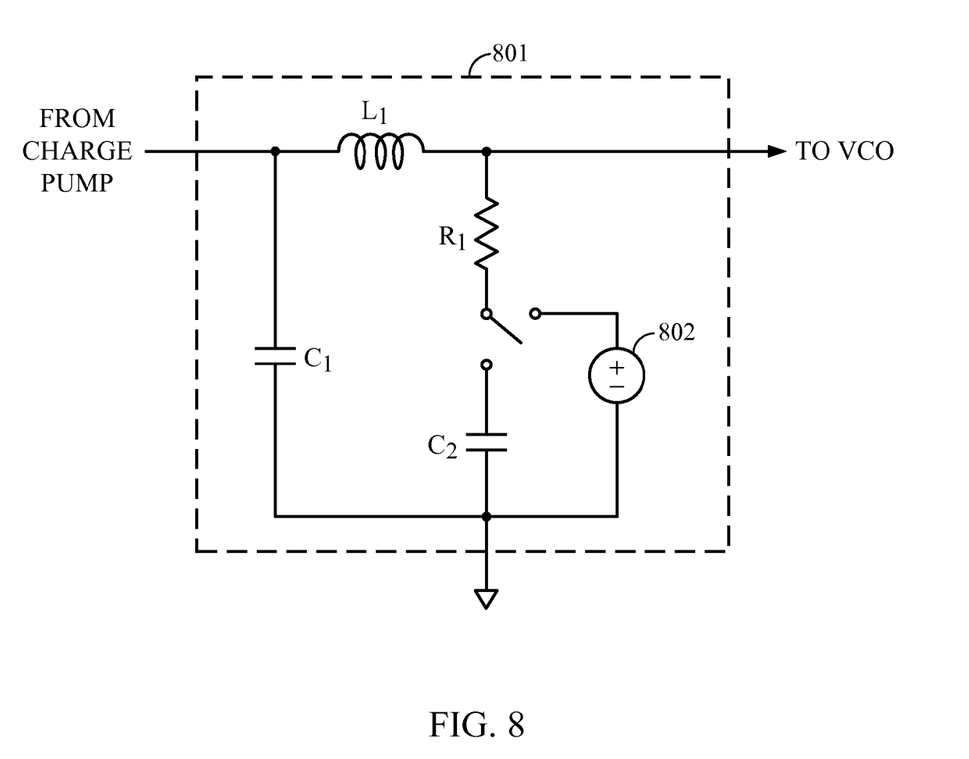
FIG. 8 shows an embodiment of a PLL which can be switched between a locking mode and a tracking mode by virtue of implementing a variable voltage source.

FIG. 8 shows an embodiment of a loop filter which can be switched between a locking mode and a tracking mode by virtue of implementing a variable voltage source. Loop filter 801 is comprised of an inductor L1, two capacitors C1 and C2, a resistor R1, a switch, and a voltage source 802. The inductor L1 is coupled in series between the charge pump and the VCO. A capacitor C1 is coupled at one end of inductor L1 (the end coupled to the charge pump) to ground. The other end of inductor L1 (the end coupled to the VCO) is coupled to the resistor R1. The other end of R1 is coupled to a switch. The switch electrically switches in the voltage source 802. When the switch is set vertically, resistor R1 is connected in series with capacitor C2 which is, in turn, coupled to ground. When the switch is set in the horizontal position, the other end of R1 is connected to the positive terminal of the voltage source 802. The negative terminal of voltage source 802 is coupled to ground. The output from loop filter 801 is coupled as an input to the VCO. When the loop filter is in the locking mode, the variable voltage source 802 is essentially turned off. With the variable voltage source 802 turned off, loop filter 801 turns the circuit into a Type 2 PLL. Once the loop is locked, the variable voltage source 802 is turned on and provides a voltage equal to the VCO voltage. This essentially removes capacitor C2 and causes circuit to run as a Type 1 PLL.

Figure 9:
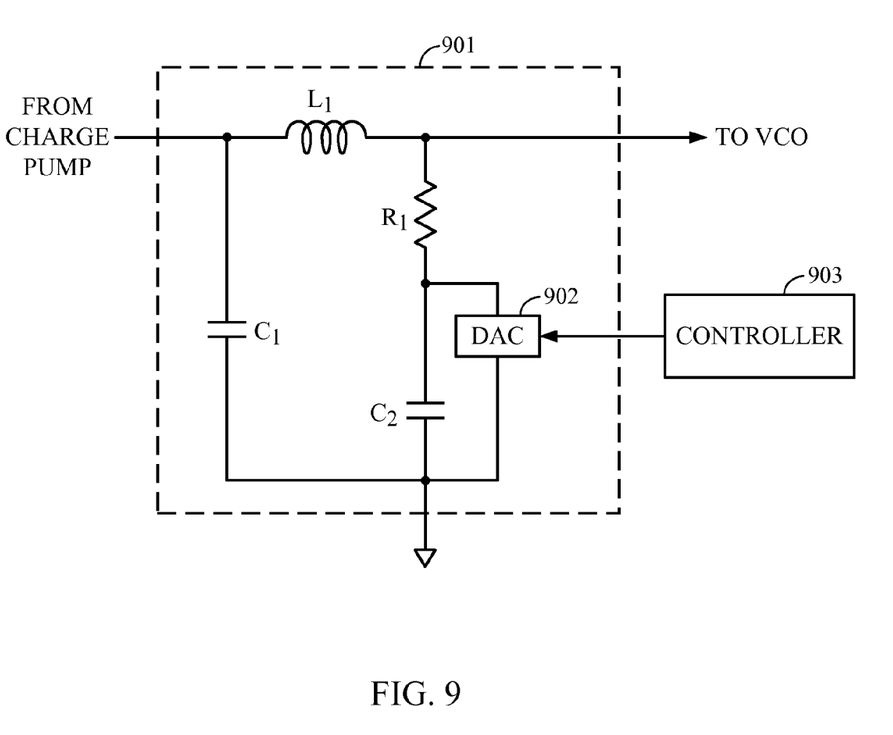
FIG. 9 shows an embodiment of a PLL which can be switched between a locking mode and a tracking mode by virtue of implementing a digital-to-analog converter.

FIG. 9 shows an embodiment of a loop filter which can be toggled between a locking mode and a tracking mode by virtue of implementing a digital-to-analog converter (DAC). Loop filter 901 includes a DAC 902. A controller 903 generates a digital signal which corresponds to the appropriate VCO voltage. DAC 902 accepts the digital input signal and converts it into an equivalent analog voltage. This voltage is selectively applied across capacitor C2 to toggle the circuit to either a Type 1 or Type 2 PLL.

In conclusion, a phase locked loop system having locked and tracking modes of operation has been disclosed. The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A phase locked loop circuit comprising:
a voltage controlled oscillator comprising an output which outputs a signal;
a phase detector coupled to the output of the voltage controlled oscillator, the phase detector being configured to compare a phase of a reference signal with a phase of the signal output from the voltage controlled oscillator; and
a loop filter coupled to the voltage controlled oscillator and the phase detector, wherein the loop filter has a locking mode of operation for establishing initial locking of the phase of the signal output from the voltage controlled oscillator to the phase of the reference signal and a tracking mode of operation for adjusting the phase of the signal output from the voltage controlled oscillator to track the phase of the reference signal, the loop filter comprising:
a plurality of capacitors, wherein the plurality of capacitors comprises a first capacitor is coupled to a charge pump and a second capacitor is coupled to the voltage controlled oscillator;
a resistor coupled to the plurality of capacitors, wherein an input signal is filtered;
a delay timer;
logic coupled to the resistor, the logic being configured to change a topology of the loop filter based on the timer, wherein the loop filter has a first topology used in a locking mode of operation and a second topology used in a tracking mode of operation;
a switch with a single pole coupled to the resistor, a first throw, and a second throw; and
an operational amplifier having a positive input coupled to the first throw of the switch and also coupled to the second capacitor, a negative input, and an output fed back to the negative input and also coupled to the second throw of the switch.

2. The phase locked loop circuit of claim 1 having an open loop transfer function with the single pole approximately at the origin when placed in the tracking mode of operation.

3. The phase locked loop circuit of claim 1, wherein the phase locked loop circuit has a first open loop transfer function with the single pole when placed in the tracking mode of operation, and wherein the phase locked loop circuit has a second open loop transfer function with two poles when placed in the locking mode of operation.

4. The phase locked loop circuit of claim 1, wherein the switch switches between the locking mode of operation and the tracking mode of operation.

5. The phase locked loop circuit of claim 4, wherein the operational amplifier buffers a voltage approximately equal to a voltage input to the voltage controlled oscillator.

6. A phase locked loop circuit comprising:
a voltage controlled oscillator comprising an output configured to output a signal;
a phase detector coupled to the output of the voltage controlled oscillator, the phase detector being configured to compare a phase of a reference signal with a phase of the signal output from the voltage controlled oscillator;
a loop filter coupled to the voltage controlled oscillator and the phase detector, wherein the loop filter has (1) a locking mode of operation for establishing lock of the phase of the signal output from the voltage controlled oscillator to the phase of the reference signal, and (2) a tracking mode of operation for adjusting the phase of the signal output from the voltage controlled oscillator to track the phase of the reference signal, wherein type of the phase locked loop in the tracking mode is lower than type of the phase locked loop in the locking mode; and
a variable voltage source coupled between the loop filter and a ground potential and adapted to produce a voltage potential to tune the loop filter, wherein the variable voltage source is configured to be operated selectively across a capacitor in the loop filter to put the phase locked loop circuit in either the locking mode of operation or the tracking mode of operation; wherein the variable voltage source is connected across the capacitor in the loop filter during the tracking mode of operation.

7. The phase locked loop circuit of claim 6, wherein the variable voltage source comprises a digital-to-analog converter.

8. A phase locked loop circuit comprising:
a voltage controlled oscillator comprising an output configured to output a signal;
a phase detector coupled to the output of the voltage controlled oscillator, the phase detector being configured to compare a phase of a reference signal with a phase of the signal output from the voltage controlled oscillator;
a loop filter coupled to the voltage controlled oscillator and the phase detector, wherein the loop filter has a locking mode of operation for (1) establishing lock of the phase of the signal output from the voltage controlled oscillator to the phase of the reference signal, and (2) a tracking mode of operation for adjusting the phase of the signal output from the voltage controlled oscillator to track the phase of the reference signal, the loop filter comprising:
a plurality of capacitors, wherein the plurality of capacitors comprises a first capacitor is coupled to a charge pump and a second capacitor is coupled to the voltage controlled oscillator;
a resistor coupled to the plurality of capacitors, wherein an input signal is filtered;
a switch with a single pole coupled to the resistor, a first throw, and a second throw; and
an operational amplifier having a positive input coupled to the first throw of the switch and also coupled to the second capacitor, a negative input, and an output fed back to the negative input and also coupled to the second throw of the switch; and
a timer which causes the switch to switch the loop filter from the locking mode of operation to the tracking mode of operation.

9. The phase locked loop circuit of claim 8, wherein switching the loop filter from the locking mode of operation to the tracking mode of operation reduces type of the phase locked loop circuit by 1.

10. A wireless device comprising:
a phase modulator configured to output an intermediate frequency signal;

a phase locked loop coupled to the phase modulator, the phase locked loop being configured to output a carrier signal modulated by a phase of the intermediate frequency signal from the phase modulator, wherein the phase locked loop has a first set of group delay characteristics for initially locking onto the phase of the intermediate frequency signal and a second set of group delay characteristics for subsequently tracking the phase of the intermediate frequency signal, and wherein the phase locked loop comprises:

a plurality of capacitors, wherein the plurality of capacitors comprises a first capacitor is coupled to a charge pump and a second capacitor is coupled to the voltage controlled oscillator;

a resistor coupled to the plurality of capacitors, wherein an input signal is filtered;

a switch with a single pole coupled to the resistor, a first throw, and a second throw; and an operational amplifier having a positive input coupled to the first throw of the switch and also coupled to the second capacitor, a negative input, and an output fed back to the negative input and also coupled to the second throw of the switch;

a delay timer configured to cause the phase locked loop to switch from a first mode of operation using the first set of group delay characteristics to a second mode of operation using the second set of group delay characteristics; and a controller which selectively controls the phase locked loop.

11. The wireless device of claim 10, wherein the phase locked loop is a Type 2 PLL when in the first mode of operation, and the phase locked loop is a Type 1 PLL when in the second mode of operation.

12. A loop filter of a phase locked loop comprising:

a plurality of capacitors, wherein the plurality of capacitors comprises a first capacitor is coupled to a charge pump and a second capacitor is coupled to a voltage controlled oscillator;

a resistor coupled to the plurality of capacitors, wherein the resistor is coupled in series with the second capacitor and wherein an input signal is filtered;

a timer; and logic coupled to the resistor, the logic being configured to change a topology of the loop filter based on the timer, wherein the loop filter has a first topology used in a locking mode of operation and a second topology used in a tracking mode of operation;

an inductor coupled between the charge pump and the voltage controlled oscillator;

a switch with a pole coupled to the resistor, a first throw, and a second throw; and an operational amplifier having a positive input coupled to the first throw of the switch and also coupled to the second capacitor, a negative input, and an output fed back to a the negative input and also coupled to the second throw of the switch.

* * * * *